United States Patent [19]
Deguchi et al.

[11] Patent Number: 5,814,194
[45] Date of Patent: Sep. 29, 1998

[54] SUBSTRATE SURFACE TREATMENT METHOD

[75] Inventors: Masahiro Deguchi, Osaka; Akihisa Yoshida, Kyoto; Makoto Kitabatake, Nara; Takashi Hirao, Osaka, all of Japan

[73] Assignees: Matsushita Electric Industrial Co., Ltd, Osaka; Research Development Corporation of Japan, Saitama, both of Japan

[21] Appl. No.: 542,008

[22] Filed: Oct. 12, 1995

[30] Foreign Application Priority Data

| Oct. 20, 1994 | [JP] | Japan | 6-254024 |
| Mar. 28, 1995 | [JP] | Japan | 7-069943 |
| Mar. 28, 1995 | [JP] | Japan | 7-069944 |

[51] Int. Cl.$^6$ .................................................. C30B 33/12
[52] U.S. Cl. .................... 204/192.1; 427/249; 427/450
[58] Field of Search .................... 427/249, 450; 204/192, 192.1

[56] References Cited

U.S. PATENT DOCUMENTS

| 5,064,682 | 11/1991 | Kiyama et al. | 427/38 |
| 5,160,405 | 11/1992 | Miyauchi et al. | 204/192.32 |
| 5,368,897 | 11/1994 | Kirihara et al. | 427/450 |
| 5,483,038 | 1/1996 | Ota et al. | 219/121.69 |

OTHER PUBLICATIONS

Study of the Ion Sputer–machining (2nd report)—Fine Machining of Diamond, by Iwao Miyamoto et al., 1980, pp. 101–106.

*Primary Examiner*—Archene Turner
*Attorney, Agent, or Firm*—Merchant, Gould, Smith, Edell, Welter & Schmidt, P.A.

[57] ABSTRACT

Cluster particles including a plurality of molecules or atoms are prepared by a gas cluster method, are accelerated, and are then irradiated onto a diamond in a low pressure atmosphere, so that the unevenness surfaces of the diamond are smoothed with no damages in the diamond. The cluster particles are prepared by the steps of forming, ionizing, mass-separating, and accelerating cluster particles. The cluster particles with a certain energy are irradiated onto the surface of the diamond. Irradiated cluster particles collide with the surface of the diamond, and then break apart into each molecule or atom while changing momentum (direction and speed) or energy. Thus, the surface of the diamond is efficiently smoothed and etched.

16 Claims, 6 Drawing Sheets

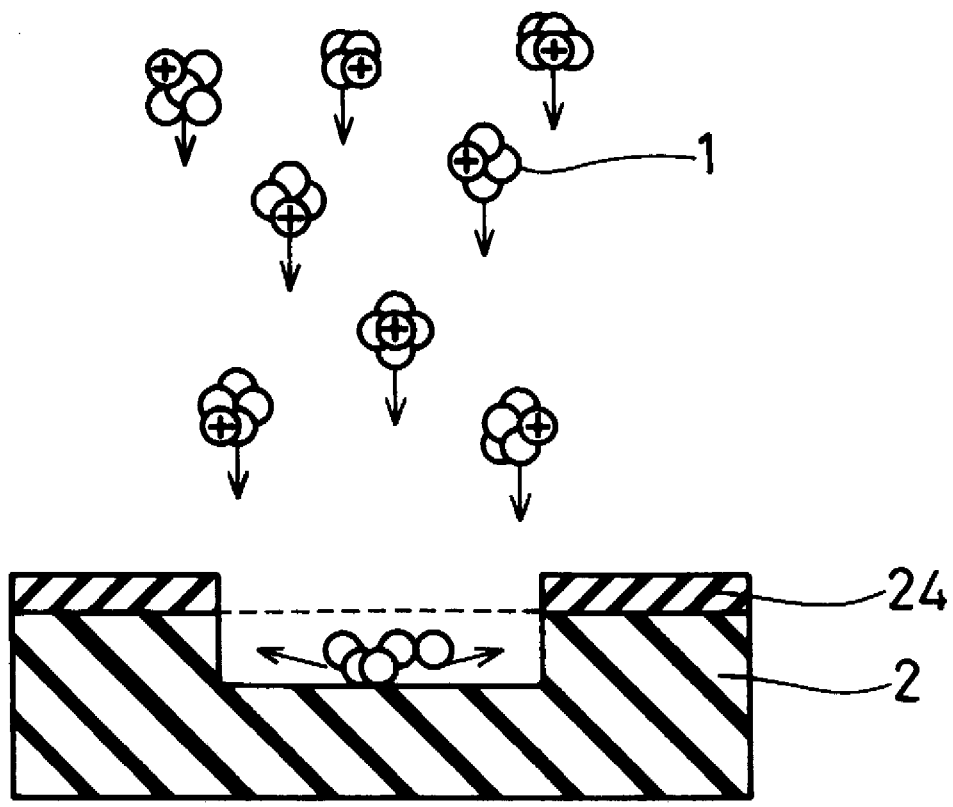
F I G. 6

SUBSTRATE SURFACE TREATMENT METHOD

FIELD OF THE INVENTION

This invention relates to a method of smoothing the surface of substrates such as diamonds which are applied for industrial purposes. More specifically, this invention relates to a surface treatment method for smoothing and etching the surface of diamonds which are useful as electronic devices, of diamond films formed by the CVD (chemical vapor deposition) method.

BACKGROUND OF THE INVENTION

Since diamond has high hardness and a wide band gap, the application of diamond is being tested as a coating material for a device, a light transmitting material, a high frequency semiconductor, an electronic device capable of operating at high temperature, or the like. As a method of artificially forming diamond, the CVD method applicable to various substrate materials is mainly used. In the CVD method source, gas including carbon atoms is dissociated and reacted at low pressure, thus forming a diamond film on a substrate surface. Generally known CVD diamond films are in a polycrystalline state, and have unevenness on the growth surface. Thus, in order to apply a CVD polycrystalline diamond film formed on a large area of a substrate to various purposes, the diamond film should be smoothed. In addition to the smoothing of a diamond surface, an etching technique of to form preferable patterns is also required.

Conventional smoothing methods of a diamond surface are a mechanical polishing treatment, the method of etching the surface with laser irradiation in an oxygen atmosphere, a reactive ion etching (RIE) method with etching gas such as argon and oxygen, a physical etching with single ion irradiation ("Diamond No Ion Beam Kako" (Ion Beam Smoothing of Diamonds), New Diamond, Vol.5, No.1, 18–25 (1989)), and the like.

However, generally speaking, diamonds are extremely hard and stable chemically, so that it is difficult to smooth diamonds by conventional mechanical polishing treatments and etching methods. Moreover, in the conventional methods, the processing efficiency and the precision are poor.

SUMMARY OF THE INVENTION

It is an object of this invention to solve the above-mentioned conventional problems by providing a method for efficiently smoothing and etching the surface of diamond films having unevenness.

In order to accomplish this objective, the substrate surface treatment method of this invention includes the steps of forming cluster particles constituted by a plurality of atoms or molecules, of accelerating the cluster particles, and of irradiating the accelerated cluster particles onto the surface of a substrate in a reduced pressure atmosphere.

It is preferable that the accelerated cluster particles are prepared by forming cluster particles formed of a plurality of atoms or molecules, by selecting cluster particles having a specified mass, and by accelerating selected cluster particles having the specified mass.

It is also preferable that the substrate is a diamond.

It is preferable that the number of atoms or molecules constituting the cluster particle is from two to 10,000.

It is further preferable that the number of the atoms or the molecules constituting the cluster particle is from 100 to 5,000.

It is also preferable that the cluster particle is in a cluster ion.

It is further preferable that the cluster particles have the same mass.

It is preferable that molecules constituting the cluster particle are inert gas molecules.

It is preferable that the molecules constituting the cluster particle are argon (Ar) molecules.

It is also preferable that the molecules or atoms constituting the cluster particle include at least oxygen as a constituent element.

It is preferable that the molecules constituting the cluster particle are carbon dioxide ($CO_2$) molecules.

It is also preferable that the molecules constituting the cluster particle are oxygen ($O_2$) molecules.

It is further preferable that the accelerated cluster particle has an energy of 200 keV or less.

It is preferable that the substrate is kept below 650° C. when the accelerated cluster particles are irradiated onto the substrate.

It is preferable that the cluster particles are irradiated onto the substrate in a reduced pressure atmosphere including a gas which contains oxygen.

It is also preferable that the surface of the substrate is smoothed so as to flatten surface features exceeding 100 nm to less than 100 nm.

The substrate surface of the first aspect of the invention includes a product prepared by the process of a substrate surface treatment method comprising the steps of: forming cluster particles comprising a plurality of atoms or molecules; accelerating the cluster particles; and irradiating accelerated cluster particles onto a surface of a substrate in a reduced pressure atmosphere.

It is preferable that the diamond on a surface thereof which has been irradiated with the accelerated cluster particles.

It is preferable that the substrate and a diamond coating on a surface of the substrate.

It is preferable that the substrate is silicon.

It is preferable that the substrate is a single crystal diamond substrate.

The substrate surface of the second aspect of the invention includes a product having a diamond surface, wherein the diamond surface has a surface roughness of no more than about 10 nm.

It is preferable that the substrate and a diamond coating on a surface of the substrate.

It is preferable that the substrate is silicon.

It is preferable that the substrate is a single crystal diamond substrate.

It is preferable that the electronic device comprising the product of the first aspect of the invention.

It is preferable that the product of the second aspect of the invention.

It is preferable that the light transmitting material comprising the product of the first aspect of the invention.

It is preferable that the product of the second aspect of the invention.

It is preferable that the product of the first aspect of the invention.

It is preferable that the product of the second aspect of the invention.

The surface of diamond films having unevenness is efficiently smoothed by the surface treatment method of the invention of forming cluster particles constituted by a plurality of atoms or molecules, accelerating the cluster particles, and irradiating the accelerated cluster particles onto a substrate in a reduced pressure atmosphere.

When particles having a certain energy are irradiated onto a material, the surface of the material is physically etched by a sputtering. Thus, polycrystalline diamond layers are smoothed by etching the uneven sur faces of the layers with the irradiation of accelerated particles. However, when particles such as single ions are irradiated so as to etch a polycrystalline diamond, the ions are injected into the diamond or give damage to the diamond. Especially due to the damage, the diamond is likely to become graphite, and it is difficult to remove the damage. Moreover, since the ions having energy are highly directional, it is difficult to reduce the only surface roughness of the diamond. Thus, the irradiation of single particles is not suitable for smoothing a diamond.

On the other hand, when cluster particles constituted by a plurality of particles (molecules or atoms) having the same energy as single particles are irradiated onto a diamond, each particle in the cluster has equivalently low energy. As a result, damage to the diamond is prevented without reducing etching properties. In addition, a multi-body collision effect is generated by interaction between the cluster particles and a diamond, thus increasing spattering efficiency and etching rate. The cluster particles collide against a diamond and break apart into individual molecules or atoms, and the molecules or atoms scatter while changing their momentum (direction and speed) and energy. Therefore, the sputtering effect in a lateral direction becomes notable, and the surface roughness of the diamond are reduced selectively and smoothed by the irradiation of the accelerated cluster particles onto the polycrystalline diamond.

The cluster particles having a specified mass are selected and irradiated onto a diamond, thus smoothing the surface of the diamond with high precision.

If the cluster particles are in an ion state, the acceleration energy or direction of the clusters is easily controlled. The selection of the mass of the clusters also becomes easy.

When the number of molecules or atoms constituting the cluster particle is from two to 10,000, the cluster particles are efficiently prepared and the diamond surface can be smoothed.

If the molecules or atoms constituting the cluster particle contain at least oxygen atoms, the smoothing efficiency of the diamond surface improves due not only to physical etching but also to a chemical effect.

It becomes possible to prepare the cluster particles which are suitable for smoothing when the molecules constituting the cluster particle are carbon dioxide ($CO_2$) molecules or oxygen ($O_2$) molecules.

The energy of accelerated cluster particles is less than 200 keV, so that no damages are produced in a diamond. When the accelerated cluster particles are irradiated, a diamond is heated at less than 650° C., so that the surface of the diamond is smoothed efficiently.

Gas made of molecules having at least oxygen as constituent element is included in the low pressure atmosphere, so that the surface of a diamond is smoothed efficiently.

When the molecules constituting the cluster particle are inert gas molecules such as argon (Ar) molecules, the cluster particles suitable for smoothing a diamond surface are prepared.

In the surface treatment method of the invention, a equipment is used which has a means of preparing clusters particle having a plurality of molecules or atoms as constituting particles by introducing gas, a means of ionizing the cluster particles, a means of accelerating the cluster particles, and a means of irradiating a cluster particle beam onto a diamond surface. Thus, the surface treatment of a diamond is carried out efficiently.

BRIEF DESCRIPTION OF THE DRAWINGS

FIG. 6 is a cross-sectional view of a substrate being irradiated with cluster particles beam during the etching treatment of a diamond.

DETAILED DESCRIPTION OF THE INVENTION

The method of smoothing diamonds of the invention is explained by referring to figures.

Figure 1:
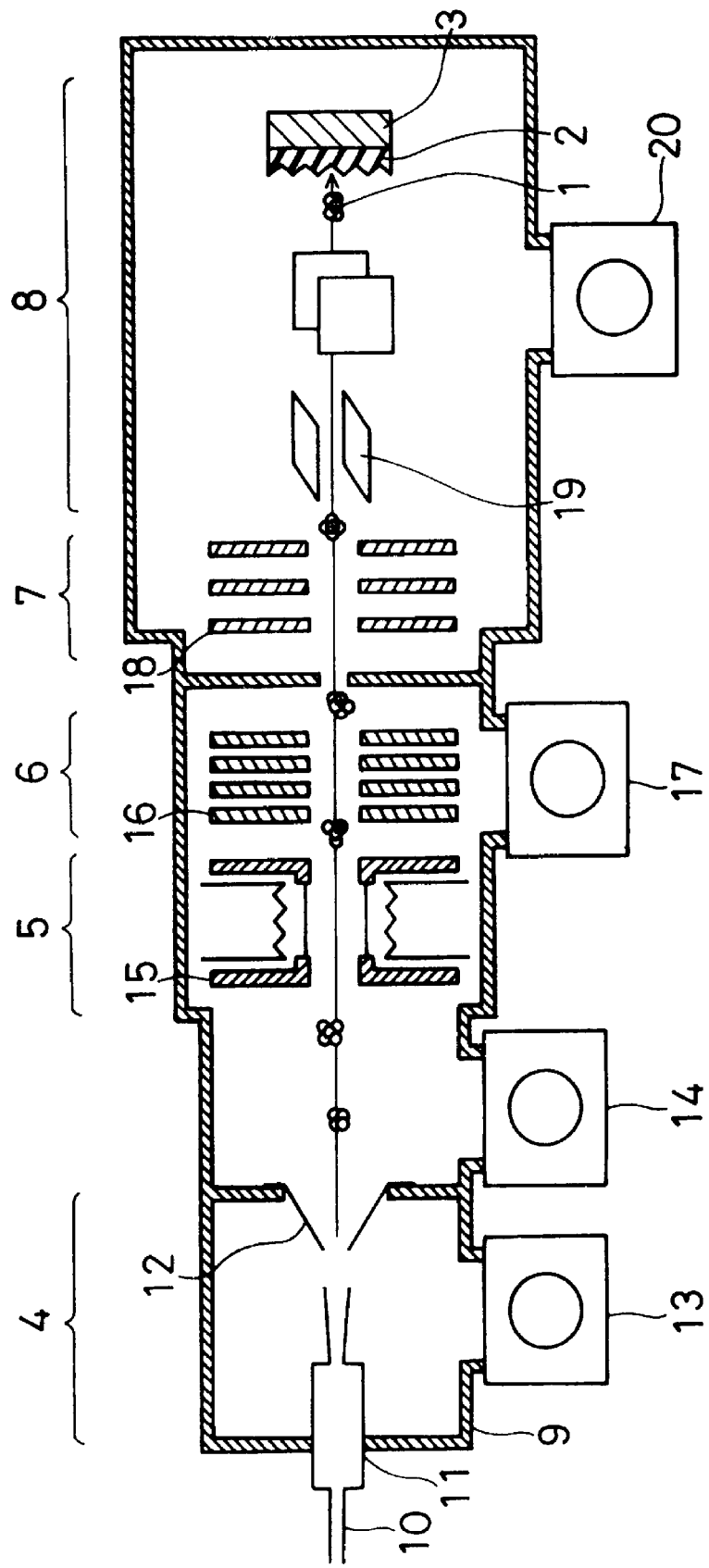
FIG. 1 is a cross-sectional view of a treatment equipment for smoothing a diamond surface of one embodiment of the invention.

FIG. 1 shows a equipment for smoothing the surface of diamonds. Cluster particles are prepared from gas introduced to a cluster particle forming section 4, and the cluster particle is ionized at an ionizing section 5. The cluster particles are selected at a predetermined number of the molecules or atoms in a mass separation section 6. The cluster particles are accelerated at an accelerating section 7, and a cluster particle beam 1 is irradiated onto the surface of a diamond 2 at an irradiating section 8.

Any method such as a generally known cluster method can be used as a method of preparing cluster particles. However, a gas cluster method is generally useful for preparing cluster particles of gaseous atoms or molecules. A nozzle 11 is applied to the wall of a vacuum chamber 9 of cluster particle cluster forming section 4, and gas is introduced through a gas inlet 10 of a nozzle 11 from outside. Gas introduced more than 2 atm is injected at supersonic speed, and the adiabatic expansion of the gas is carried out in the chamber kept at $1 \times 10^{-4}$–$1 \times 10^{-6}$ Torr by an exhaust pump 13. Thus, the cluster particle beam of coagulated particles is prepared. The cluster particle beam is shaped by a skimmer 12.

Figure 3:
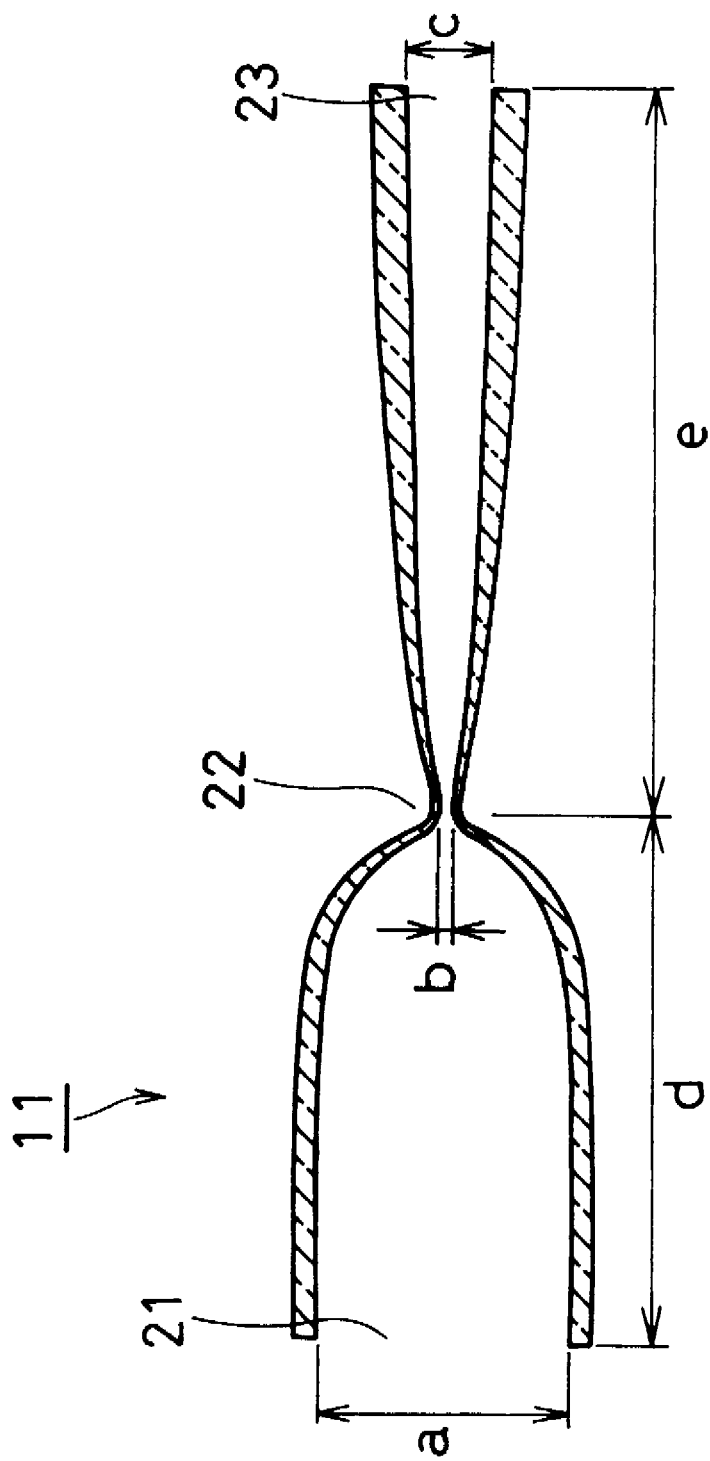
FIG. 3 is a cross-sectional view of a nozzle used in treatment equipment.

Nozzle 11 is made of quartz glass, and has a cross section shown in FIG.3. In FIG.3, 21 is a gas inlet; 22 is a neck; and 23 is a gas outlet (injecting mouth). Gas inlet 21 has an aperture diameter(a) of about 8 mm, and length(d) of about 20 mm. Neck 22 has an aperture diameter(b) of about 0.1 mm. Gas outlet (injecting mouth) 23 has an aperture diameter(c) of about 3 mm, and length(e) of about 30 mm. The molecules or atoms constituting the cluster particle are weakly bonded by force such as van der Waals force. The size of a cluster particle (number of particles) can be controlled by the pressure of the source gas or the size of the aperture formed in the nozzle (diameter: about 0.1 mm). A cluster particle beam can be easily generated from an inert gas such as Ar or molecular gas and compound gas such as $CO_2$ and $O2$. A mixed gases of the above-mentioned gas may also be used if necessary. The cluster particles are sent to ionizing section 5 through skimmer 12.

At ionizing section 5, electric charge is added to each cluster particle by an electron ionization method or other method, thus easily focusing a cluster particle beam, controlling acceleration and direction of the beam, and selecting the mass of the beam. One particle or atom of the cluster particle is provided with monovalent electric charge. In other words, among several dozen to several thousand molecules or atoms, only a single molecule or atom is ionized. As a result, each cluster particle functions as if it is an ion with several dozen to several thousand-times the mass. The electron ionization method with thermoelectrons emitted from an ionizer 15 can be applied as an ionization method. In this method, thermoelectrons are generated by applying 150 V ionization voltage to a filament made of W (tungsten), and the cluster particles are then ionized. The atmosphere in ionization section 5 is kept at low pressure of $1\times10^{-5}$ Torr by applying an exhaust pump 14.

A mass separating filter 16 or the like is applied at mass separating section 6, thus selecting the cluster particles by their mass. In other words, the molecules or atoms constituting the cluster particle are selected at a preferable number, thereby providing a homogeneous cluster particle beam. As a result, a diamond is smoothed with improved precision. A method of separating mass by field (decelerating field method), a separation method with the aberration of an electrostatic lens, E×B filter (or Wien filter) method applying magnetic field and electric field strength, or the like is used as a mass separating method. However, the method is not limited to the methods mentioned above. In the decelerating field method, mass is separated by applying a decelerating electrode to the latter part of an accelerating electrode, so that the mass separating section is straight and the structure of the equipment becomes simple. The straight mass separating section and the simple equipment structure are also obtained from the separation method applying the aberration of an electrostatic lens, since an aperture for passing preferable ions is formed at the latter part of an electrostatic lens focusing a beam. In the examples of the invention, the decelerating field method with the application of about 0–300 V decelerating field voltage was applied. The atmosphere in mass separating section 6 was kept at a low pressure of less than $1\times10^{-5}$ Torr by using exhaust pump 17.

A field is applied to cluster particle beam 1 by accelerator 18 at an accelerating section 7, and the beam is accelerated to a predetermined accelerating energy. The beam is then sent to an irradiating section 8. By setting the accelerating energy to less than 200 keV, a diamond is smoothed with little damage. The beam is deflected by a deflector 19 at irradiation section 8. After introducing the beam to a predetermined irradiation section, cluster particle beam 1 is irradiated onto a diamond 2. If the number of particles or atoms in each cluster particle is N, the energy of a each molecule or atom of the cluster is one Nth of the energy of single ion irradiation. In addition, beam current is N times as much as the beam current of the single ion irradiation; charge-mass ratio is one Nth of the ratio of the single ion irradiation. Thus, the cluster particle beam is equivalently low, energy and high current beam. The accelerating voltage is preferably higher than 5keV in consideration of the leading of ions and the efficiency of transport and the lens system. In order to achieve a lateral sputtering effect, the number of atoms or molecules constituting the cluster particle for irradiation is preferably at least 100. In consideration of the production efficiency of cluster particles, however, the number is preferably less than 5,000. The atmosphere in accelerating section 7 and irradiation section 8 is kept at a low pressure of less than $1\times10^{-4}$ Torr, more preferably from $1\times10^{-6}$ Torr to $1\times10hu -6$ Torr, by exhaust pump 20.

Figure 2:
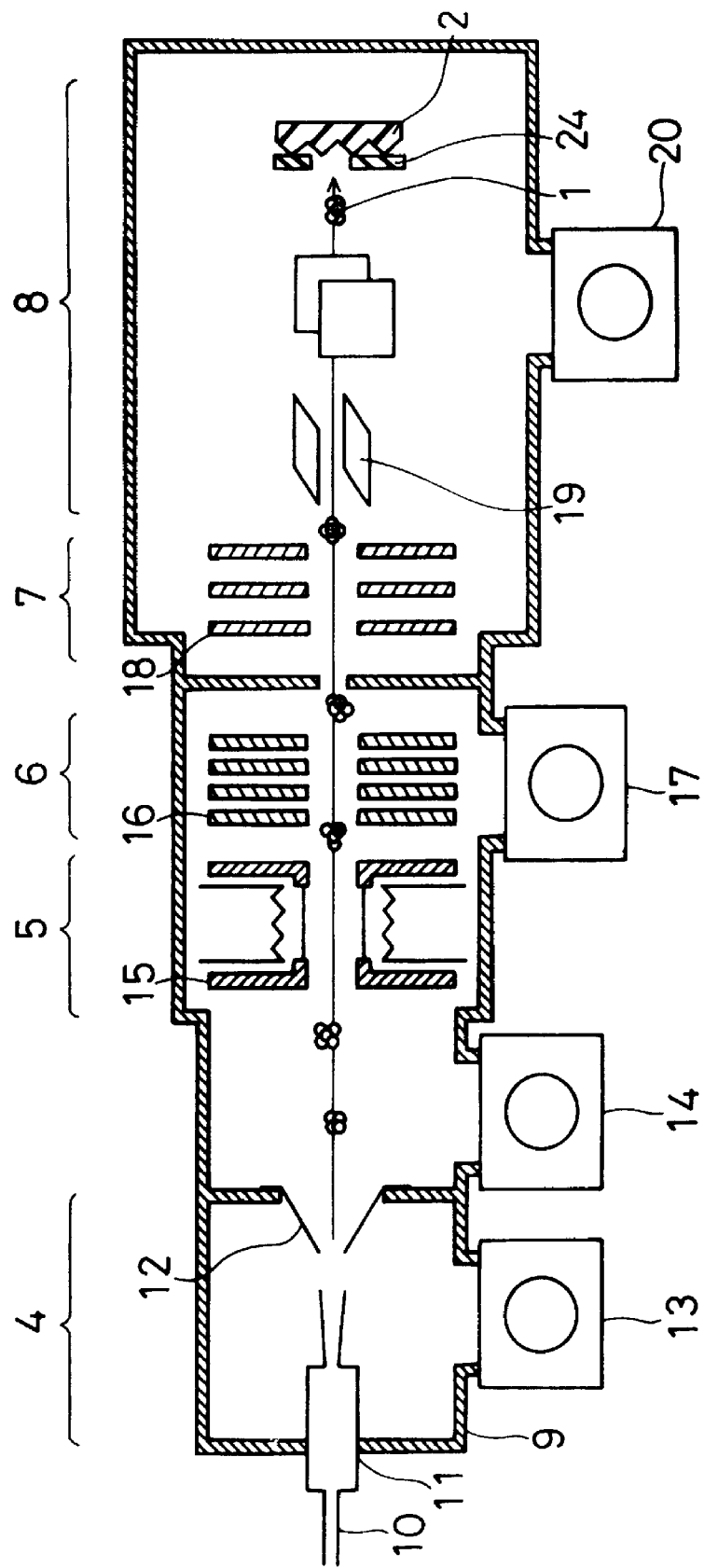
FIG. 2 is a cross-sectional view of a treatment equipment for etching a diamond surface of one embodiment of the invention.

FIG. 2 shows a basic structure of a equipment for etching a diamond of the invention. The structure and operation of the equipment is the same as those in FIG. 1. In this example, a mask material 24 such as silicone dioxide is formed on a diamond 2 so as to distinguish the etching section of the diamond from the non-etching section.

Clusters particle of inert gas molecules such as argon (Ar) molecules are suitable for smoothing the diamond mentioned above.

By applying particles including at least oxygen atoms such as carbon dioxide ($CO_2$) molecules or oxygen ($O^2$) molecules, smoothing efficiency improves due not only to physical but also chemical etching.

If the diamond is heated at less than 650° C. during the irradiation of accelerated cluster particles, the interaction between the cluster particles and the diamond becomes apparent and the diamond can be efficiently smoothed. There is no lower limit on the temperature, and the diamond can be kept at room temperature, and can be cooled or heated.

The cluster particles are irradiated onto the diamond in a low pressure atmosphere containing gas of molecules having at least oxygen as a element, so that the diamond can be efficiently etched.

Figure 4:
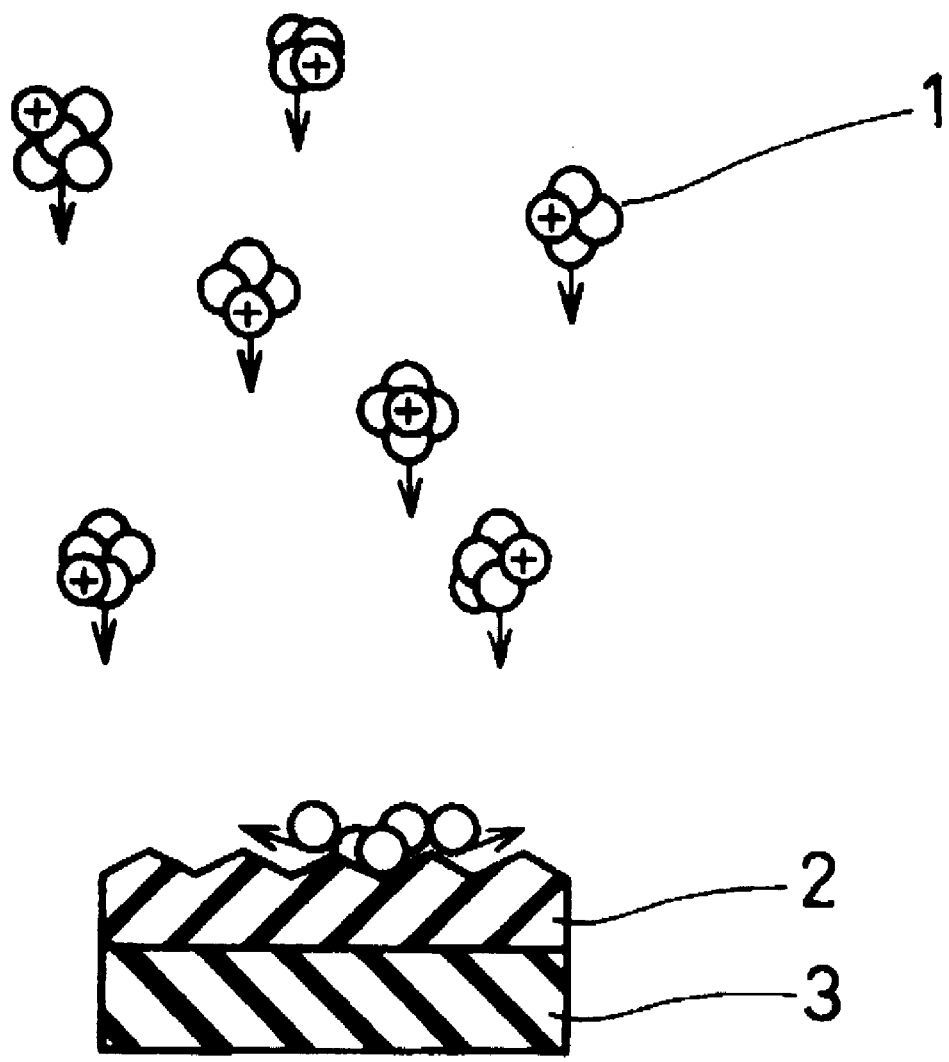
FIG. 4 is a schematic view of irradiating cluster particles beam to smooth a diamond surface.

FIG. 4 is a schematic view of the surface of a diamond being smoothed with the irradiation of the cluster particle beam. Cluster particles 1, prepared through the steps of preparation, ionization, mass separation and acceleration, are irradiated onto a diamond 2 with predetermined energy. Irradiated cluster particles 1 collide against diamond 2, and then break apart into each individual molecule or atom. Sputtering is carried out on the surface of the diamond while the momentum (direction and speed) and energy of the molecules or atoms are changing. As a result, the diamond is efficiently smoothed. In the figure, 3 indicates a substrate such as silicon.

Figure 5A:
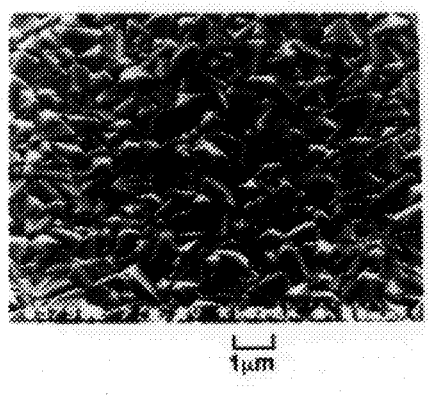
FIG. 5A shows SEM image of CVD diamond surface at a magnification of SEM photograph of the CVD diamond films before etching.
Figure 5C:
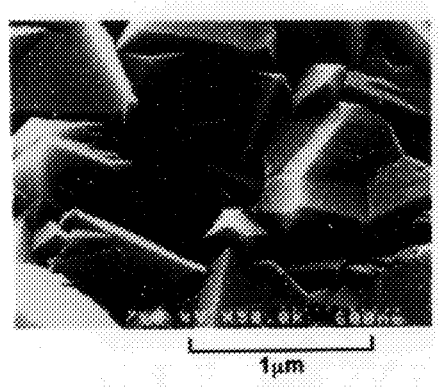
FIG. 5C shows SEM image of the CVD diamond surface at a magnification of 50,000 times before etching.
Figure 5B:
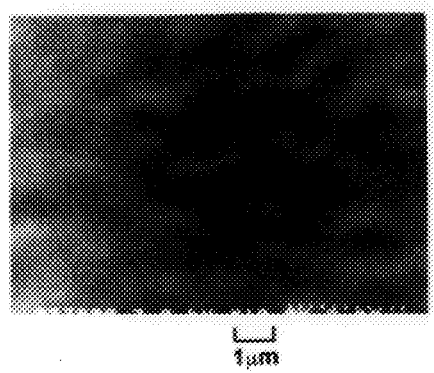
FIG. 5B shows SEM image of the CVD diamond surface at a magnification of 10,000 times after etching.
Figure 5D:
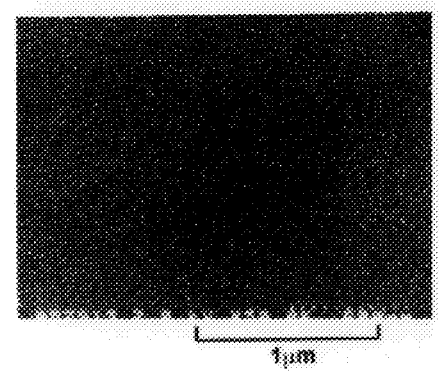
FIG. 5D shows SEM image of the CVD diamond surface at a magnification of 50,000 times after etching.

FIG. 5A and FIG. 5C show SEM image of the surface of a diamond before etching. FIG. 5B and FIG. 5D show SEM image of the surface of a diamond after etching. These figures are enlarged pictures of the diamond surface taken by a scanning electron microscope.

FIG. 6 shows an etching process of a diamond by the irradiation of cluster particles As in the figure, cluster particles 1 are irradiated onto the diamond, thus sputtering the surface of the diamond. As a result, the diamond is efficiently smoothed at high precision. In the figure, 24 indicates a mask material. There is no limitation on the mask material, but silicone dioxide is generally applied as the mask material.

This invention will be explained in further detail by referring to the following specific examples.

EXAMPLE 1

A polycrystalline diamond layer was formed on a 20×20× 0.5 mm silicon (Si) substrate by a microwave plasma CVD method. In the microwave plasma CVD method, microwave is applied to source gas, thus generating plasma and forming a diamond. As the source gas, carbon monoxide gas which was diluted to 2–10% by volume by hydrogen was applied. The diamond layer was 15 μm thick. The surface of the diamond layer exhibit unevenness, and the layer had about 1 μm surface roughness (FIG. 5A and FIG. 5C).

The diamond layer formed on the Si substrate was then placed in the cluster particle beam irradiation section of a diamond processing equipment. After evacuating the chamber, Ar cluster particles prepared from a gas cluster source were irradiated. The Ar cluster particles were prepared by supplying argon gas to a nozzle at 1–3 atmospheres pressure. It was possible to control the number of molecules constituting each cluster particle to 200–3,000. In this example, the supply pressure of the source gas was set at 3 atm, and Ar cluster particles (about 3,000 particles for each cluster) were prepared. After the cluster particles were ionized, they were accelerated at 20 kV acceleration voltage, and were irradiated onto the diamond at $1 \times 10^{17}$ ions/cm In other words, Ar molecules equivalently having about 7 eV energy and about $3 \times 10^{20}$ ions/cm$^2$ were irradiated. As a result, the roughness of surfaces of the diamond were reduced, and the surface roughness of the diamond became less than 10 nm (FIG. 5B and FIG. 5D).

The same results were provided even if irradiation conditions such as irradiation energy were changed or another inert gas such as xenon was used.

EXAMPLE 2

When Ar cluster particles were irradiated onto a diamond under the same conditions as in Example 1, the diamond was heated to 600° C. Thus, the same flat surface as the one found in Example 1 was formed on the diamond even if the dose of Ar cluster particles to the diamond was reduced by half.

The same results were provided even if irradiation conditions such as irradiation energy were changed or another inert gas such as xenon was used.

EXAMPLE 3

As in the previous examples, a polycrystalline diamond layer was formed on a 20×20×0.5 mm silicon(Si) substrate, and Ar cluster particles were irradiated from a gas cluster source. In this example, irradiated Ar cluster particles were selected by mass, and only Ar cluster particles having a particular particle number were irradiated. Ar cluster particles composed of 3,000 Ar molecules were ionized, and were accelerated by 20 kV voltage. Only $1 \times 10^{17}$ ions/cm$^2$ were irradiated onto the diamond. As a result, the surface roughness of the diamond was significantly reduced, and the diamond was smoothed at higher precision.

The same results were provided even if irradiation conditions such as irradiation energy were changed or another inert gas such as xenon was used.

EXAMPLE 4

As in the previous examples, a polycrystalline diamond layer was formed on a 20×20×0.5 mm silicon (Si) substrate. Ar cluster particles were irradiated in a low $5 \times 10^{-5}$ Torr atmosphere including oxygen. The irradiation conditions were the same as those in Example 1. As a result, the dose of Ar cluster particles irradiated onto the diamond was cut in half, thus providing a flat surface as in Example 1.

The same results were provided even if irradiation conditions such as irradiation energy were changed or another inert gas such as xenon was used.

EXAMPLE 5

As in the previous examples, a polycrystalline diamond layer was formed on a 20×20×0.5 mm silicon (Si) substrate. Then, $CO_2$ cluster particles prepared from a gas cluster source were irradiated. $CO_2$ cluster particles composed of 1,000–3,000 $CO_2$ molecules were ionized, and were accelerated at 30 kV voltage. Only $1 \times 10^{17}$ ions/cm$^2$ were irradiated onto the diamond, thus reducing the concave and convex surfaces of the diamond. The surface roughness of the diamond became about 10 nm.

The same results were provided even if irradiation conditions such as irradiation energy were changed or another gas such as oxygen was applied. The same results were also obtained when the diamond was heated with the irradiation of particles, the particles were selected by mass, or the particles were irradiated in a reduced atmosphere including oxygen.

EXAMPLE 6

A 5 μm thick homoepitaxial diamond layer was formed on a 2×2×0.5 mm single crystal diamond substrate by a microwave plasma CVD method. A 5 μm thick silicone dioxide film having a predetermined pattern for etching was deposited on the surface of the diamond layer.

The single crystal diamond layer formed on the substrate was placed in a cluster particle beam irradiating section of a diamond processing equipment. After evacuating the chamber, accelerated cluster particle were irradiated. The supply pressure of the source gas was three atmospheres, and Ar cluster particles formed of 1,000–3,000 Ar monacules were prepared. The cluster particles were then ionized, and were accelerated at 20 kV accelerating voltage. Only $1 \times 10^{17}$ ions/cm$^2$ were irradiated onto the diamond layer. In other words, about $10^{20}$ Ar molecules equivalently having about 7–20 eV energy were irradiated. As a result, the diamond layer formed on the substrate was etched about 2 μm deep. The surface roughness also became less than 10 nm.

The same results were provided even if irradiation conditions such as irradiation energy were changed or another inert gas such as xenon was used.

EXAMPLE 7

In the same condition as in Example 6, the diamond was heated to 600° C. while Ar cluster particles were irradiated onto the diamond. As a result, etching rate was increased while the smoothness of the diamond surface was maintained, thus etching the diamond surface with high efficiency.

The same results were provided even if irradiation conditions such as irradiation energy were changed or another inert gas such as xenon was used.

EXAMPLE 8

As in the previous examples, homoepitaxial diamond layer was formed on a 2×2×0.5 mm single crystal diamond substrate, and Ar cluster particles prepared from a gas cluster source were irradiated. The Ar cluster particles were selected by mass, and only cluster particles having a certain particle number were irradiated. The Ar cluster particles having 3,000 molecules were ionized, and were accelerated at 20 kV voltage. Only $1 \; 10^{17}$ ions/cm$^2$ were irradiated onto the diamond layer. As a result, the smoothness of the diamond surface was improved from the smoothness found in Example 6 while the rate speed of the diamond was not changed. The diamond was etched with higher precision than that found in Example 6.

The same results were provided even if irradiation conditions such as irradiation energy were changed or another inert gas such as xenon was used.

EXAMPLE 9

As in the previous examples, homoepitaxial diamond layer was formed on a 2×2×0.5 mm single crystal diamond substrate. Then Ar cluster particles were irradiated in a low $5 \times 10^{-5}$ Torr pressure atmosphere including oxygen. The supply pressure of source gas was three atmospheres. After Ar cluster particles were prepared and ionized, they were accelerated at 20 kV acceleration voltage. Only $1 \times 10^{17}$ ions/cm$^2$ were irradiated onto the diamond. As a result, compared with Example 6, the etching rate improved while the smoothness of the diamond was maintained. Thus, the diamond was etched with improved efficiency.

The same results were provided even if irradiation conditions such as irradiation energy were changed or another inert gas such as xenon was used.

EXAMPLE 10

As in the previous examples, homoepitaxial diamond layer was formed on a 2×2×0.5 mm single crystal diamond substrate, and $CO_2$ cluster particles prepared from a gas cluster source were irradiated. Ar cluster particles composed of 1,000–2,000 Ar molecules were ionized, and were accelerated at 20 kV voltage. Only $1 \times 10^{17}$ ions/cm$^2$ were irradiated onto the diamond. As a result, the diamond layer formed on the substrate was etched and became smooth with less than 10 nm surface roughness.

The same results were provided even if irradiation conditions such as irradiation energy were changed or another gas such as oxygen was applied. The same results were also obtained when the diamond was heated during the irradiation of particles, the particles were selected by mass, or the p articles were irradiated in a low pressure atmosphere including oxygen.

Instead of the single crystal diamond film mentioned above, any diamond such as a polycrystalline diamond film formed by the CVD method or a single crystal diamond synthesized under high pressure composition can also be formed.

The invention may be embodied in other forms without departing from the spirit or essential characteristics thereof. The embodiments disclosed in this application are to be considered in all respects as illustrative and not restrictive, the scope of the invention is indicated by the appended claims rather than by the foregoing description, and all changes which come within the meaning and range of equivalency of the claims are intended to be embraced therein.

What is claimed is:

1. A substrate surface treatment method comprising the steps of:

forming cluster particles comprising a plurality of atoms or molecules;

accelerating said cluster particles; and irradiating accelerated cluster particles onto a surface of a substrate in a reduced pressure atmosphere.

2. The method of claim 1, wherein the accelerated cluster particles are prepared by the steps of:

preparing cluster particles comprising a plurality of atoms or molecules;

selecting cluster particles having a specified mass; and accelerating the using electric field selected cluster particles having a specified mass.

3. The method of claim 1, wherein the substrate is a diamond.

4. The method of claim 1, wherein the atoms or molecules of a cluster particle are from two to 10,000 in number.

5. The method of claim 4, wherein the atoms or molecules of a cluster particle are from 100 to 5,000 in number.

6. The method of claim 1, wherein the cluster particle is ion.

7. The method of claim 1, wherein the cluster particles have the same mass.

8. The method of claim 1, wherein the molecules constituting the cluster particle are inert gas molecules.

9. The method of claim 8, wherein the molecules constituting the cluster particle are argon (Ar) molecules.

10. The method of claim 1, wherein the molecules or atoms constituting the cluster particle comprise oxygen as a constituent.

11. The method of claim 10, wherein the molecules constituting the cluster particle are carbon dioxide ($CO_2$) molecules.

12. The method of claim 10, wherein the molecules constituting the cluster particle are oxygen ($O^2$) molecules.

13. The method of claim 1, wherein the accelerated cluster particle has 200 keV or less energy.

14. The method of claim 1, wherein the substrate is kept below 650° C. when the accelerated cluster particles are irradiated.

15. The method of claim 1, wherein the cluster particles are irradiated onto the substrate in a reduced pressure atmosphere including gas which comprises oxygen as an element.

16. The method of claim 1, wherein the surface of the substrate is smoothed, so that substrate surface features of 100 nm or more are reduced to less than 100 nm.

* * * * *